United States Patent [19]
Sanderson

[11] 3,982,184
[45] Sept. 21, 1976

[54] PHASE DIFFERENT DETECTOR AND DISPLAY

[75] Inventor: Albert E. Sanderson, Carlisle, Mass.

[73] Assignee: Inventronics, Inc., Carlisle, Mass.

[22] Filed: May 6, 1974

[21] Appl. No.: 467,221

Related U.S. Application Data

[60] Continuation of Ser. No. 399,920, Sept. 24, 1973, abandoned, which is a division of Ser. No. 249,942, May 3, 1972, abandoned.

[52] U.S. Cl. ............................... 324/83; 307/269; 324/79 D
[51] Int. Cl.² ........................................ G01R 25/00
[58] Field of Search ............... 324/78 J, 83 D, 83 R, 324/161, 166; 84/454, 455, 1.06, 1.16; 307/220 R, 232, 233, 269, 210, 221 R; 328/134, 141, 155; 235/103.5 R; 340/324, 325, 331, 332, 339, 341

[56] References Cited
UNITED STATES PATENTS

| | | | |
|---|---|---|---|
| 3,303,421 | 2/1967 | Kelling | 324/83 D |
| 3,304,504 | 2/1967 | Horlander | 307/269 |
| 3,461,392 | 8/1969 | Hughes | 324/78 J |
| 3,577,178 | 5/1971 | Hawley | 324/83 D |
| 3,696,293 | 10/1972 | Hoffmann | 324/79 D |
| 3,745,544 | 7/1973 | Ono | 324/83 D |
| 3,820,022 | 6/1974 | Watt | 324/83 D |

*Primary Examiner*—R. V. Rolinec
*Assistant Examiner*—Michael J. Tokar
*Attorney, Agent, or Firm*—Cesari and McKenna

[57] ABSTRACT

A phase difference detector and display unit. A digital pulse train at the frequency to be measured is combined with a multiple-phase digital clock output having a reference frequency to produce multiple-phase signals which low-pass filters convert to dc output signals. Each output signal indicates the instantaneous phase difference between the digital pulse train and a respective one of the clocking signals.

Each dc output signal controls the light from a pair of lamps. Individual lamps in each pair are diametrically opposed on a circle with all the pairs being spaced around the circumference of the circle. The lamp pairs reach maximum brightness in sequence, providing the illusion of a rotating light bar. The direction of rotation indicates whether the digital pulse train is higher or lower in frequency than the reference while the speed of rotation is proportional to the frequency deviation from the reference.

15 Claims, 3 Drawing Figures

PHASE DIFFERENT DETECTOR AND DISPLAY

This is a continuation application of Ser. No. 399,920, filed Sept. 24, 1973 (now abandoned), which was a divisional application of Ser. No. 249,942, filed May 3, 1972 (now abandoned).

BACKGROUND OF THE INVENTION

This invention generally relates to the measurement of electrical properties and more specifically to apparatus which detects and displays electrical phase difference.

There are several phase detection and display devices known in the prior art. Some of these are adapted for use with instruments for measuring the frequency of musical notes. In one, a high frequency oscillator produces an output clock signal at a selected frequency. A series of frequency dividers and an octave selector switch provide a means for generating a reference signal at a selected subharmonic frequency. The tuning aid combines this reference signal and an audio signal representing the note being tuned either to generate an audible beat note or to deflect a pointer on an indicating meter. Unfortunately, these aids lose accuracy as the tuned note comes into frequency with the reference. When the beat rate decreases below 20 Hz, and especially 1 Hz, the audible beat note becomes inaudible. Similarly, an indicating meter uses a frequency-to-current converter so the current level goes to zero at a zero beat. As the current approaches zero, the visual indication becomes less accurate. Both types of display, therefore, lose accuracy at the very time it is most necessary.

In another unit, the tuner attaches a piezoelectric transducer to a particular string or a sounding board to produce a corresponding electrical signal that is applied to the vertical deflection plates of a cathode ray tube. A selector switch, crystal controlled oscillator and a series of frequency dividers generate a selected reference signal which energizes the horizontal deflection plates of the tube. In using this circuit, one apparently assumes, erroneously, that a piano generates a constant, repetitive wave form. In fact, a piano string generates an extremely complex wave form with a fundamental frequency and partials slightly out of tune with each other but often of the same magnitude. Furthermore, the component frequencies are not necessarily constant in relative magnitude because a string vibrates in many modes, each with its own damping constant. These factors cause the waveform to change continuously, so the display is difficult to interpret.

Another problem relates to dynamic response. Initially, the amplitude of the signal is sufficient to drive the display off the screen. As the tone dies out, the input to the vertical deflection plates falls below the minimum level necessary for generating a usable display. An obvious solution is installing a variable gain amplifier to maintain the output at a constant value. However, a circuit which provides satisfactory results over the wide range of conditions and waveforms which the piano generates is difficult to attain in practice. If the variable gain circuit actually tracks the decay, it may follow the waveform and provide a dc output signal. Therefore, this solution is not practicable especially in view of the non-linear parameters or conditions and the short interval for a readable display. This effective dynamic range further complicates tuning because adjusting a string while monitoring the display is very difficult.

Still another tuning aid receives the audio signal from a piano and generates a corresponding electrical signal to energize the blanking or Z axis circuitry of a cathode ray tube. A circular generator energizes X and Y axis deflection plates with a reference frequency so the electron beam describes a circle on the screen. If a note is in tune with the reference, the audio signal blanks and unblanks the electron beam during the same part of each revolution to thereby display one arcuate segment. A second harmonic input signal produces two such arcuate segments; a third harmonic input signal, three segments; and so forth. If a given note is not exactly harmonically related to the reference, the segments rotate. The direction of rotation indicates whether the note is sharp or flat while the speed of the rotation indicates the difference in frequencies. As notes in the upper piano produce a display with a number of segments, the spaces between adjacent sectors diminish; and the absolute frequency deviation which produces a persistent display tends to decrease. Furthermore, alternately blanking and unblanking the beam produces an indefinite segment termination on the screen. When the frequency deviation is small, the indefinite termination makes it difficult to determine whether the edges of the segments are moving. When notes in the lower range of the piano are tuned, the tuner must try to adjust while the tuning aid responds to harmonics, since subharmonics of the reference frequency generate complete circles on screen.

Therefore, it is an object of this invention to provide a circuit for measuring phase differences.

Another object of this invention is to provide a circuit for measuring and displaying phase differences.

SUMMARY

A phase detector circuit constructed in accordance with my invention receives an incoming signal and converts it to a square-wave conditioned input signal. A reference clock provides an output which is converted to a multiple-phase reference signal. The phase detector compares the conditioned input signal against each reference phase signal to generate pulse signals corresponding to each reference signal with the pulse width of each representing the phase differences between the conditioned output signal and its respective reference phase signal.

Other circuitry converts these pulse signals to four dc signals which individually energize one of four pairs of lamps. The lamps may be equiangularly spaced on a circle with lamps in each pair being diametrically opposed. The magnitude of the dc signals are normally proportional to the respective pulse widths. Accordingly, when a note signal is in phase with one of the four reference phase signals, one pair of lamps is at maximum brightness. Any frequency deviation causes pairs of lamps to reach full brilliance in succession, so the display looks like a rotating light bar. The direction of rotation indicates the direction of deviation while the speed of rotation indicates the magnitude of the deviation.

This invention is pointed out with particularity in the appended claims. A more thorough understanding of the above and further objects and advantages of this invention may be attained by referring to the following description taken in conjunction with the accompanying drawings.

DESCRIPTION OF AN ILLUSTRATIVE EMBODIMENT

General Discussion

Figure 1:
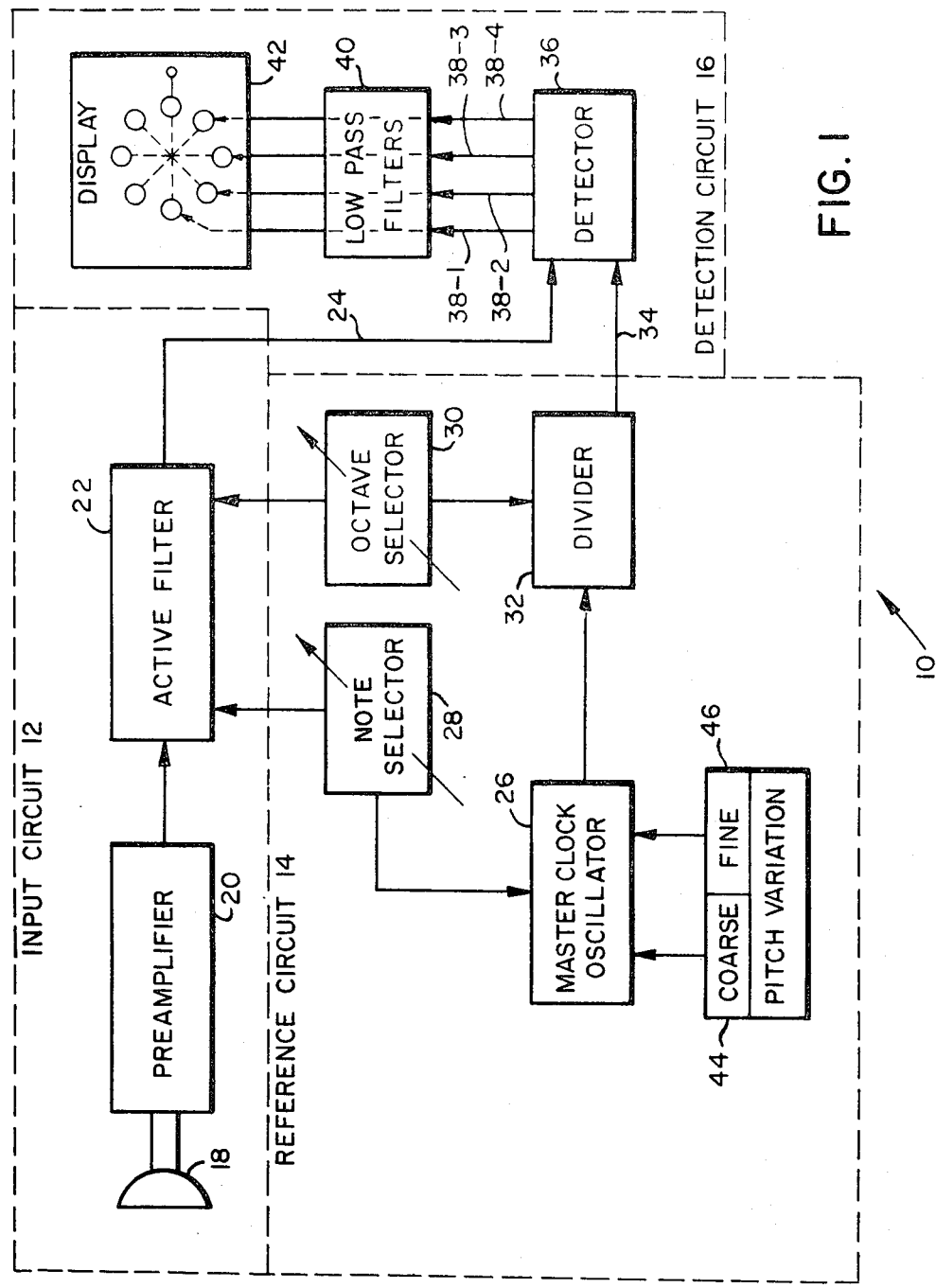
FIG. 1 is a block diagram of a tuning aid constructed in accordance with my invention.

As shown in FIG. 1, my tuning aid 10 comprises an input circuit 12, a reference circuit 14 and a detection circuit 16. The input circuit 12 comprises a microphone 18 which picks up signals generated as a musical instrument is tuned. For example, on a piano, it detects the sound emanating from a struck note. A conventional preamplifier 20 and an active filter 22 isolate the signal being tuned from other signals which the microphone 18 senses (i.e., an active bandpass filter). The filter 22 preferably is a tunable filter which has a quality factor greater than ten. Such bandpass filters are known in the art. The filter 22 produces an audio output signal on a conductor 24 which connects to the detection circuit 16.

The reference circuit 14 produces a second input signal to the detection circuit 16. A variable frequency master clock oscillator 26 covers the twelve notes which are two octaves above the highest octave to be tuned, for purposes which will become apparent later. A particular oscillator frequency is selected by a note selector 28 in the form of a two-pole switch which simultaneously tunes the active filter 22 by changing one or more tuning resistors as known in the art. An octave selector 30 in the form of a three-pole switch controls the active filter 22 by changing capacitors therein as known in the art and further controls a frequency divider 32 which, in response to the signals from the master clock oscillator 26, provides a square wave output signal which is twice the frequency determined by the note selector 28 and octave selector 30. That is, if the selectors 28 and 30 are set to select a musical A at 440 Hz [hereinafter A(440)] resistors and capacitors in the filter 22 tune it to a center frequency of 440 Hz while the master clock oscillator 26 generates a 28.16 kHz output and an 880 Hz signal appears on the conductor 34 leading from the divider 32.

The detection circuit 16 of this invention has a detector 36 which receives both the audio signal on the conductor 24 and the reference signal on the conductor 34. It generates four output signals on output conductor 38-1, 38-2, 38-3 and 38-4. Each output is a constant-amplitude, pulse-width-modulated signal with pulse width varying as a function of the phase difference between a note signal on the conductor 24, derived from the instrument being tuned, and a reference signal on the conductor 34, which is the output from the clock divider 32. The pulse repetition rate is equal to the selected reference frequency and the rate at which the pulse width changes on each conductor depends on the frequency difference between the note frequency and one-half the reference frequency, the pulses on each conductor having unvarying width if the struck note is in tune with the reference. Low-pass filters 40 couple the pulse signals from the detector 36 to a display 42. At any given time, a filtered dc output is proportional to the width of an input pulse. If there is a frequency deviation, each low-pass filter output varies up and down between 0 to 200% of its normal value at a rate which is proportional to the frequency difference.

The display unit 42 preferably contains an array of lamp means in which one pair of lamps (e.g., light-emitting diodes) is energized by each low-pass filter output. Mechanically, each lamp in a pair may be diametrically opposed in a circle, with adjacent lamp pairs separated by 45°. As becomes apparent later, the signals which energize lamps in space quadrature are 180° out of phase electrically. If a first lamp pair is at full brilliance, a second lamp pair displaced 90° from the first, is off. The lamp pairs that are displaced ± 45% from the first are also off, for reasons I discuss later.

When an incoming note is in tune, that is, the digital input and digital clock signals are in phase, one pair of lamps may be at or nearly at full brilliance or two pairs may be partially lit. However, the relative brilliance of the lamps does not change. As a result, the display appears stationary. If there is a frequency difference, the individual lamp pairs reach full brilliance in one of two sequences. If the note, or digital input signal is "sharp" (i.e., at a higher frequency than one-half the frequency of the reference signal), then the lamps reach full brilliance in a clockwise sequence; so the display appears to rotate clockwise. When a note is flat, the sequence is reversed and the display appears to rotate counterclockwise. As the repetition rate at which a given set of lamps reaches full brilliance depends upon the frequency difference, the rate at which the display appears to rotate indicates the magnitude of the difference.

Specific Discussion

The heart of this invention is in the manner in which the detector 36 and low-pass filters 40 condition input signals and display the results. Still referring to FIG. 1, the signal the master clock oscillator 26 and the divider 32 place on conductor 34 has twice the frequency of the selected note and constitutes a digital clock signal. Division by at least two in the divider 32 means that the outputs from the master clock oscillator 26 must be four times the highest frequencies to be measured. In one specific embodiment using a C as a lower octave limit and a B as an upper limit, the master clock oscillator 26 generates nominal signals in the range between 16744 and 31609 Hz. Depending on the setting of the octave selector 30, the clock divider 32 divides the oscillator output by a factor of $2^n$ where $1 \leq n \leq 8$. When the octave selector 30 is set for the highest octave, the divider 32 divides the oscillator frequency by 2, while a division by 256 occurs when the octave selector 30 is set for the lowest octave. As a specific example, setting the note selector 28 to A causes the oscillator 26 to generate a 28160 Hz signal. The frequency of the signal on the conductor 34 and the frequency which the tuning aid will sense are then as follows:

| Octave Number | Signal On Conductor 34 | Frequency of Signal Being Measured |
|---|---|---|
| 8 | 14,080 | 7,040 |
| 7 | 7,040 | 3,520 |
| 6 | 3,520 | 1,760 |
| 5 | 1,760 | 880 |
| 4 | 880 | 440 |
| 3 | 440 | 220 |
| 2 | 220 | 110 |

| Octave Number | Signal On Conductor 34 | Frequency of Signal Being Measured |
|---|---|---|
| 1 | 110 | 55 |

Detection Circuit 16

Figure 2:
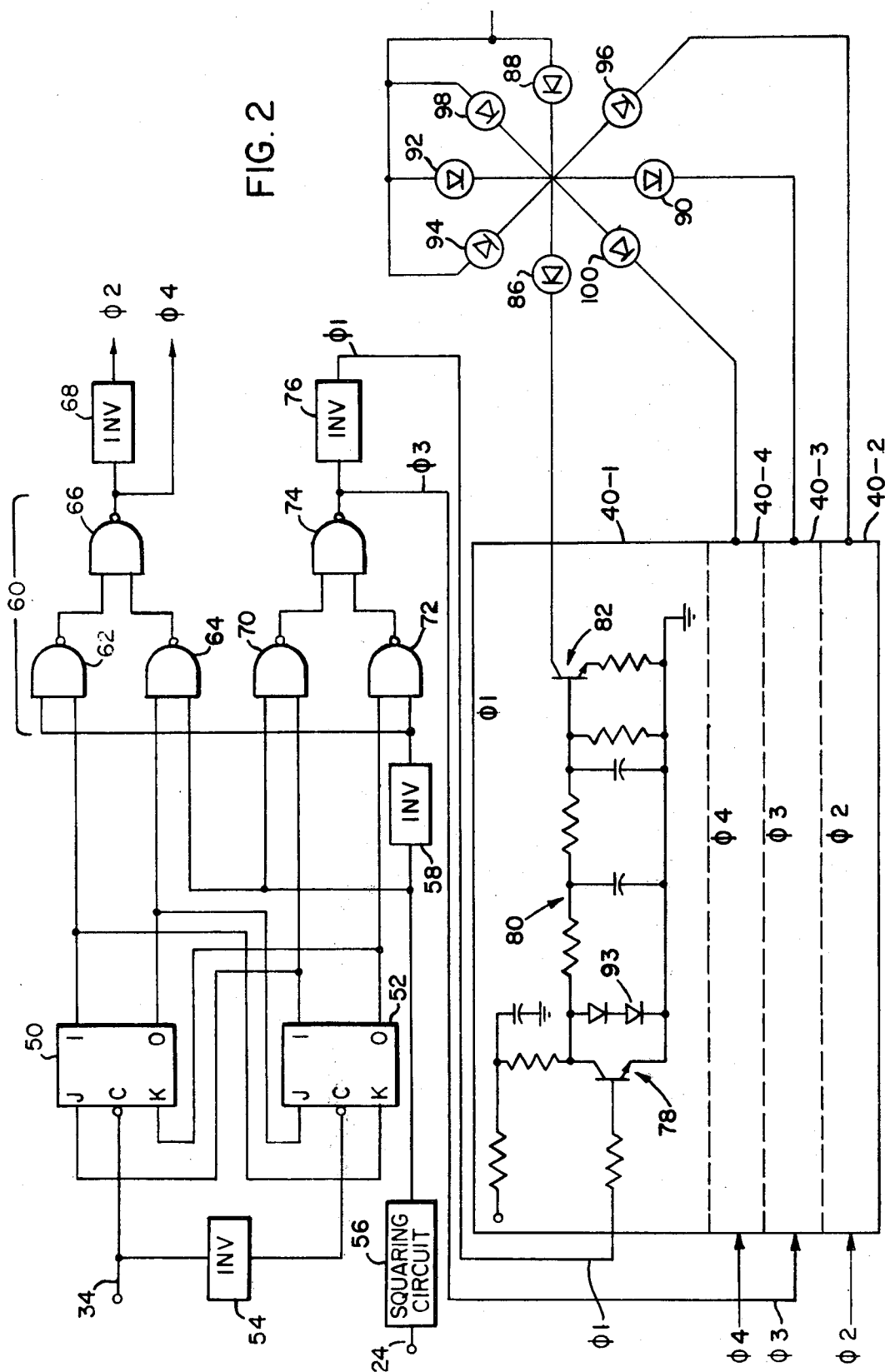
FIG. 2 is a circuit schematic which illustrates certain details of the circuit shown in FIG. 1.

Now referring to FIG. 2, the signal on conductor 34 energizes the inverting clocking terminals of JK flip-flops 50 and 52, the latter clocking input receiving its signal from an inverter 54. The nature of the cross-coupling shown in FIG. 2 determines the flip-flop response to clocking signals. In this particular embodiment, the JK flip-flops 50 and 52 are cross-coupled so the set (1) and reset (0) output terminals of the JK flip-flop 50 energize the K and J input terminals of the JK flip-flop 52, respectively. The set (1) and reset (0) output terminals of the JK flip-flop 52 connect to the J and K input terminals of the flip-flop 50, respectively.

Figure 3:
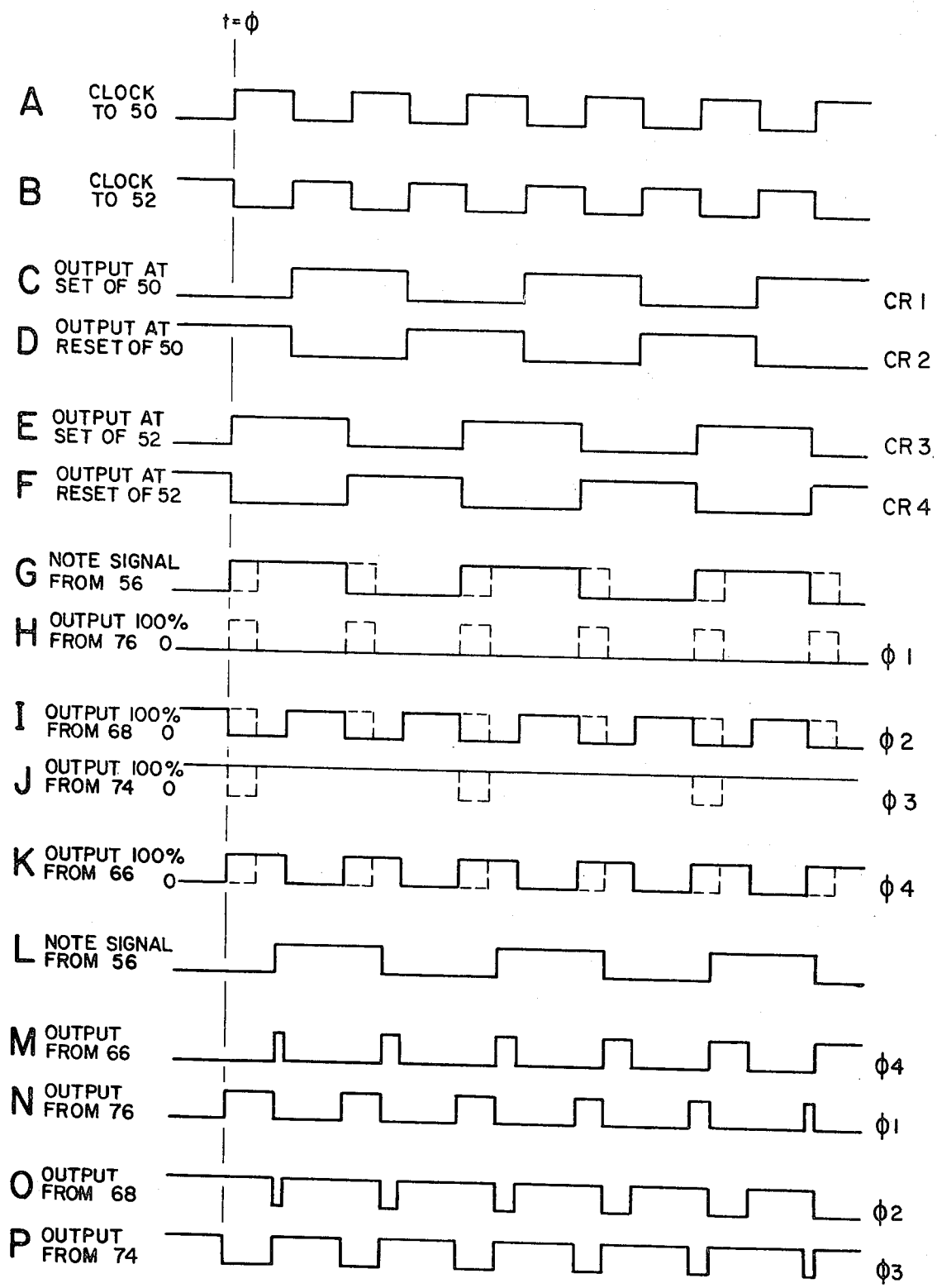
FIG. 3 is a graphical analysis of the operation of a portion of the circuit shown in FIG. 1.

Now referring to FIG. 3, Graph A represents the binary clocking signal, a square wave that energizes the JK flip-flop 50, while Graph B is a timing chart for the complementary clocking signal to the flip-flop 52 from the inverter 54. Assuming for a moment that at $t=0$ the clocking signal to the flip-flop 52 falls while both the flip-flops 50 and 52 are reset, the trailing, or falling, edge of the complementary clocking signal sets the flip-flop 52 and generates a clock reference signal designated as CR3 and a complement CR4 signal as shown in Graphs E and F. Next, the trailing, or falling, edge of the clocking signal sets the flip-flop 50, which generates the CR1 and CR2 signals as shown in Graphs C and D. A succeeding clocking signal to the flip-flop 52 resets it (Graphs E and F). This conditions the flip-flop 50 to be reset by the trailing, or falling, edge of its next clocking signal. As a result, it takes two cycles of the clocking signal from the conductor 34 to cycle each CR signal from the flip-flops 50 and 52. This additional frequency division means the four CR signals from the flip-flops 50 and 52 each are at the selected frequency. As is also apparent, the CR signals are in quadrature. Looking at the positive-going pulse edges, the sequence is CR3-CR1-CR4-CR2, the leading edge of each pulse being spaced 90° in phase from the leading edges of preceding and following pulses. Hence, the outputs of flip-flops 50 and 52 constitute means for generating a four-phase set of reference signals.

Graph G depicts a note, or binary input, signal after the signal in the conductor 24 is conditioned in a conventional squaring circuit 56 in FIG. 2. In this particular example, the note is in tune with the reference selected frequency and the signal in solid lines is in phase with the CR3 signal. In addition, an inverter 58 produces a complementary note signal which is in phase with the CR4 signal.

Referring to FIGS. 2 and 3, the binary four-phase clock reference signals and the note signal energize a phase modulator circuit 60 which combines the digital input signal and each clock reference logically. Although logical AND and other logical combinations are adapted for use in this invention, very good results are obtained with a circuit 60 comprising two exclusive-OR circuits. The first exclusive-OR circuit comprises NAND circuits 62, 64 and 66; the second, NAND circuits 70, 72 and 74. The output from a NAND circuit 66 is designated as the $\phi 4$ output; the complementary $\phi 2$ output comes from an inverter 68. There are two conditions which cause the $\phi 4$ output signal to be at a zero level representing a FALSE output from the exclusive OR circuit:
1. the note, or binary input, signal is positive and CR1 is positive, or
2. the note, or binary input, signal is ZERO and CR1 is ZERO.

Otherwise the $\phi 4$ signal is at a ONE level indicating that the exclusive-OR function is met. Similarly, the $\phi 3$ signal is ZERO when:
1. the note, or binary input, signal is positive and CR4 is positive, or
2. the note, or binary input, signal is ZERO and CR4 is ZERO.

Otherwise, the $\phi 3$ signal is at a ONE level.

Therefore, the $\phi 4$ output signal indicates whether the CR1 signal (the set condition of the flip-flop 50) and the note, or binary input signal satisfy an exclusive-OR condition. Similarly, the $\phi 1$, $\phi 2$, and $\phi 3$ signals indicate the exclusive-OR condition of the note, or binary input, signal and each of the CR3, CR2 and CR4 signals, respectively.

Still referring to FIGS. 2 and 3 and considering the note, or binary input, signal shown by the solid line in Graph G, the note signal and set output from the flip-flop 52 are exactly in phase. Either the NAND circuit 70 or 72 keeps the $\phi 3$ output signal at a positive or logic 1 value, so the $\phi 3$ signal has a 100% duty cycle. Obviously, the $\phi 1$ output signal is always at a logic zero or a minimum value and has a 0% duty cycle. On the other hand, the necessary conditions to shift the $\phi 4$ output signal to a positive state exist 50% of the time, so the $\phi 4$ and $\phi 2$ output signals are complementary pulse trains at twice the selected frequency and each has a 50% duty cycle.

Now referring back to FIG. 2, each phase-modulated output signal is passed through one of four identical energizing circuits, such as low-pass filter circuits 40, $\phi 1$ filter circuit 40-1 being shown in detail. A switching circuit 78 together with diodes 93 is responsive to the $\phi 1$ output signal and provides a constant amplitude, variable width pulse input to a conventional two-section RC low-pass filter 80. The low-pass filter 80 normally varies its output voltage as a function of the duty cycle to control a non-linear lamp amplifier 82 which, in turn, energizes light-emitting diodes 86 and 88.

In the particular situation shown by graph G in FIG. 3, the $\phi 1$ output signal (graph H) is constant at zero (a 0% duty cycle). This places a maximum positive voltage on the base electrode of the transistor amplifier 82, so the amplifier 82 keeps the diodes 86 and 88 on; and they generate a maximum light output. However, the $\phi 3$ output signal (graph J) and the output of the $\phi 3$ filter circuit 40-3 are at maximum and minimum levels respectively, so diodes 90 and 92 are turned off.

On the other hand, the $\phi 2$ and $\phi 4$ output signals (graphs I and K) have a 50% duty cycle. In order to enhance the display, the filters are constructed so the lamps in a pair do not light until the duty cycle of an output signal falls below some threshold representing a duty cycle less than 50%. Specifically, the diodes 93 in the switching circuit 78 clip the input signal to a value which equals the forward breakdown voltage of two diodes (i.e., about 1.2 volts total with silicon diodes). The lowpass filter 80 is constructed so that at approximately a 50% duty cycle, the filter output cannot forward bias the base-emitter junction of the amplifier 82 so the light-emitting diodes that the amplifier controls do not conduct. When the duty cycle reaches a value which causes the filter output to forward bias the base-emitter junction, the amplifier 82 turns on and the corresponding diodes conduct whereupon the diodes emit light at a level which is proportional to the current through the amplifier.

If the note signal shown in Graph G merely shifts slightly in phase, without changing frequency, as shown by the dotted lines, the $\phi 1$ output signal no longer has a 0% duty cycle signal. Hence, the energizing current through the diodes 86 and 88, which responds to the duty cycle for the $\phi 1$ output signal, decreases. If the phase-shift is to the right as shown by the dashed lines in Graph G, the $\phi 2$ output signal duty cycle increases, so diodes 94 and 96 remain off. In this particular case, the $\phi 3$ duty cycle decreases but remains above a 50% duty cycle so the diodes 90 and 92 remain off. However, the $\phi 4$ signal has a duty cycle which is less than 50% so the diodes 98 and 100 turn on slightly.

Graph L shows the signal from the squaring circuit 56 when the note, or binary input, signal frequency is greater than the standard, or binary clock, frequency. Graphs C through F and L show that each output signal duty cycle varies in time. For the time dependency upon the phase relationship between the note, or binary input, signal and corresponding phase reference signal interval shown, it is apparent from Graph M that the $\phi 4$ duty cycle is increasing from a minimum. Meanwhile, the duty cycle of the $\phi 2$ output signal (Graph O) is decreasing from a maximum. As time continues, the $\phi 4$ output signal will reach a maximum duty cycle and then return to a minimum; and the variation is substantially linear with time. Similarly, the duty cycle of $\phi 1$ output signal (Graph N) is decreasing from 50% while the $\phi 3$ output signal (Graph P) is increasing from 50%. As a result, the light output from diodes 98 and 100 decreases, while diodes 86 and 88 turn on with their brightness increasing as the duty cycle of the $\phi 1$ signal continues to decrease.

Furthermore, the light output from diodes 98 and 100 continues to decrease until the threshold is reached, whereupon they turn off. At about the time they reach one-half brilliance, however, the output from the filter circuit 40-2 will have reached the same value, so that diodes 94 and 96 will also be at about half brilliance. When the diodes 94 and 96 reach full brilliance, the tuner sees what appears to have been a rotation of a light bar 45° clockwise and this apparent rotation continues, so that the display appears as a bar which rotates at one-half the beat frequency.

When the beat frequency exceeds about 5 to 10 Hz, the display becomes persistent to the eye. However, at this beat frequency, each low-pass filter begins to attenuate its output so the maximum current level, and the average energy level to the lamps, decreases. This reduces the average brilliance of the lamps. So when the display is persistent, the tuner adjusts a string to increase brilliance. At about 25 Hz, there is enough filter attenuation to turn all the lamps off. This poses no problem, however, because a 25 Hz difference is readily detectable by ear. At the low end of the piano, it represents an octave while at the high end of the piano it represents a tuning error of 10% of a semitone. It is apparent that the individual input pulses to each of the filter circuits, such as the filter 80 in filter circuit 40-1, do not affect directly the light emitting diodes. This is because the pulses themselves are at the frequency of the reference signal which is always greater than the cut-off frequency for the low pass filters.

Master Clock Oscillator 26

For the tuning aid to be effective, there should be some provision to vary the frequency of the master clock oscillator 26 shown in FIG. 1. Any stable oscillator which can provide an appropriate input to the detector 36 in FIG. 1 can be used. One such oscillator is disclosed in my co-pending application Ser. No. 399,923 filed Sept. 24, 1973 now U.S. Pat. No. 3,879,684 issued on Apr. 22, 1975 and assigned to the same assignee as the present invention.

The tuning aid shown in FIG. 1 is sensitive and accurate. Tests show that the display has visible motion when the phase shift is less than 10°, with the accuracy being dependent upon the time the tuning aid senses the tone and the stability of both the tone and note. This means that the tuning aid senses a frequency difference which produces less than a 10° phase shift over the interval the note signal exists. When operated from a battery power supply, the tuning aid is very stable. Tests against a tuning fork show no displacement after 10 seconds of tone.

As apparent, my phase detector and display circuit is not limited to monitoring audio frequencies. The detector 36, low-pass filters 40 and display 42 effectively sense and display frequency differences. Sensitivity is independent of the frequency being measured, within the frequency limits imposed on the individual circuit components. As a result, the detection circuit 16 in FIG. 1 is useful for adjusting any variable frequency source to a standard.

There are several possible modifications for the detection circuit 16. At very high input frequencies, the sensitivity can be decreased by a frequency divider in each input to the detector 16. For example, if both inputs are at the same frequency and both are divided by 4, the display turns off at a 100 Hz difference, rather than 25 Hz. Alternatively, a sequence memory circuit may monitor the output from low-pass filters 40. In the specific structure shown in FIG. 2, the output sequence of 40-1, 40-2, 40-3, 40-4, a sharp note. The memory circuit would energize one or two lights to display the sequence direction.

Therefore, it is apparent that there are many modifications and alterations which can be made to my phase difference detector, especially the described circuits. It is the object of the appended claims to cover all such variations and modifications as come within the true spirit and scope of the invention.

What I claim as new and desire to secure by Letters Patent of the United States is:

1. A phase difference display for continuously displaying the phase difference between a binary input signal at an unknown frequency and a binary clock signal at a known frequency, said phase difference display comprising:
A. first input means for receiving the binary input signal of unknown frequency,
B. second input means for receiving the binary clock signal of a known frequency, and
C. comparison and display circuit means including:
  i. means responsive to the binary clock signal for producing a plurality of binary spaced phase reference signals at a known frequency, said reference signals including a first phase reference signal and a second phase reference signal that is other than a complement of the first phase reference signal, ii. a phase difference detector including a plurality of logical combination means connected to receive each of the phase reference signals, each of said logical combination means combining, according to a binary logical function, the input signal of unknown frequency from said first input means and a corresponding one of the phase reference signals for transmitting a binary logical output signal which has a duty cycle that varies in accordance with the phase relationship between the input signal from said first input means and the corresponding phase reference signal, and iii. a plurality of visual display means, each said visual display means being responsive to one of the binary logical output signals for displaying the phase relationship between the input signal from said first input means and the corresponding phase reference signal, said plurality of visual display means providing a continuous display of the direction of change and the rate of change of the phase of the input signal from said first input means.

2. A phase difference display as recited in claim 1 wherein each of said display means comprises:

A. averaging means responsive to each binary logical output signal for generating an analog signal which varies as a function of the phase relationship between the digital binary input signal and a corresponding phase reference signal, and B. at least one lamp means connected with said averaging means, said averaging means varying the intensity of a corresponding lamp means whereby the lamp means in all of said display means reach maximum intensity in a sequence and rate which depends upon the phase difference.

3. A phase difference display as recited in claim 2 wherein said logical combination means comprise exclusive OR circuit means responsive to the binary input signal and the spaced phase reference signals.

4. A phase difference display as recited in claim 3 wherein a plurality of lamp means are connected in series with each of said averaging means, said lamp means being equally spaced on the circumference of a circle, at least two lamp means in a series lamp set being connected to each averaging means and said lamp means being equiangularly spaced about the circle, each lamp set being evenly spaced around the circle.

5. A phase difference display as recited in claim 3 wherein each said averaging means comprises a low-pass filter connected to be energized by each binary logical output signal, each low-pass filter having a cut-off frequency substantially below the lowest frequency to be detected.

6. A phase difference display as recited in claim 1 wherein said phase difference detector includes means for producing the complement of each binary logical output signal as an additional binary logical output signal and each said display means comprises:

A. averaging means responsive to a binary logical output signal for generating an analog signal which varies as a function of phase relationship between the binary input signal and the corresponding one of the phase reference signals, and B. a plurality of lamps electrically in series with said averaging means, all of said averaging means varying the intensity of the respective ones of said lamps whereby the lamps reach maximum intensity in a sequence and rate which depends upon the phase difference.

7. A phase difference display as recited in claim 6 wherein said means for producing the spaced phase reference signals produces two signals and said plurality of display means includes four pairs of lamps equiangularly spaced on the circumference of a circle, each lamp in a pair being diametrically opposed and each pair of lamps being connected to a corresponding output from each of said averaging means.

8. A phase difference display as recited in claim 7 wherein each of said averaging means includes a low-pass filter having a cut-off frequency lower than the lowest frequency to be detected.

9. A phase difference display as recited in claim 7 wherein each of said averaging means additionally comprises means for establishing an intermediate analog signal level below which the corresponding lamps are off, the intensity of a lamp, when on, varying in accordance with the difference between the analog signal and the threshold signal level, the threshold signal level being selected so that at substantially any time at least a pair of analog signals turn on lamps in corresponding ones of said display means.

10. A phase difference display as recited in claim 2 wherein:

A. said spaced phase reference signal producing means transmits a third phase reference signal that is at the same frequency as the other phase reference signals and that is other than a complement of the second phase reference signal, and B. each of said averaging means additionally comprises means for establishing an intermediate analog signal threshold level below which the corresponding lamp is off, the intensity of a lamp, when on, varying in accordance with the difference between the analog signal and the threshold signal level, the threshold signal level being selected so that at substantially any time at least a pair of analog signals turn on lamps in corresponding ones of said display means.

11. A phase difference display as recited in claim 1 wherein said means for producing the spaced phase reference signals includes means for converting the clocking signal into a pair of phase reference signals which are electrically in quadrature, said logical combination means comprising first and second exclusive OR circuits, said first exclusive OR circuit being energized by one of said phase reference signals and the digital input signal and said second exclusive OR circuit being energized by the other phase reference signal and the digital input signal.

12. A phase difference display for continuously displaying the phase difference between a binary input signal at unknown frequency and a binary clock signal at a known frequency, said phase difference display comprising:

A. first input means for receiving the binary input signal,

B. second input means for receiving the binary clock signal, and

C. a detection circuit including:

i. detector means for producing a plurality of binary logical output signals each having a duty cycle that is responsive to the phase relationship between the binary input signal and the binary clock signal, and ii. a plurality of visual display means, each said visual display means being energized by one of the binary logical output signals, said plurality of visual display means being energized in a sequence dependent upon changes in the phase relationship of the binary input and binary clock signals, said plurality of visual display means collectively constituting a display array which continuously displays the phase relationship between the binary input and binary clock signals.

13. A phase difference display as recited in claim 12 wherein said display means comprise lamp means.

14. A phase difference display as recited in claim 12 wherein each said display means comprises lamp means oppositely disposed on the circumference of a circle, said lamp means being equiangularly disposed about the circumference.

15. A phase difference display as recited in claim 13 wherein each of said lamp means comprises a pair of light emitting diodes.

* * * * *

UNITED STATES PATENT OFFICE
CERTIFICATE OF CORRECTION

Patent No. 3,982,184                     Dated September 21, 1976

Inventor(s) Albert E. Sanderson

It is certified that error appears in the above-identified patent and that said Letters Patent are hereby corrected as shown below:

Column 6, line 48 "graph" should be "Graph"
Column 7, line 25, delete ".For the time dependency"
          and insert --depending--
    "     line 28, after "signal" insert --. For
          the time--
Column 9, line 31, delete "digital binary" and
          insert --binary--

Signed and Sealed this

Seventeenth Day of May 1977

[SEAL]

Attest:

RUTH C. MASON
*Attesting Officer*

C. MARSHALL DANN
*Commissioner of Patents and Trademarks*